TEMPERATURE COMPENSATING DEVICE FOR A CRYSTAL OSCILLATOR

Filed Sept. 18, 1964 2 Sheets-Sheet 1

TEMPERATURE COMPENSATING DEVICE FOR A CRYSTAL OSCILLATOR

Filed Sept. 18, 1964 2 Sheets-Sheet 2

3,270,296

TEMPERATURE COMPENSATING DEVICE FOR A CRYSTAL OSCILLATOR

Susumu Aizawa, Suwa-gun, Nagano-ken, and Kinji Fujita, Suwa-shi, Japan, assignors to Kabushiki Kaisha Suwa Seikosha, Chuo-ku, Tokyo-to, Japan, a joint-stock company of Japan Substituted for abandoned application Ser. No. 256,379, Feb. 5, 1963. This application Sept. 18, 1964, Ser. No. 397,524
Claims priority, application Japan, Aug. 24, 1962, 37/35,028
2 Claims. (Cl. 331—116)

This invention relates to a device for compensating for temperature effects for crystal oscillators. More specifically, the present invention, in its broader aspects, contemplates, by installing in the circuit of a crystal oscillator a capacitor having temperature characteristics such as to compensate for frequency variations due to variations in the ambient temperature of the oscillator including a crystal vibrator and circuit elements, obtaining an oscillator of extremely high stability of frequency over a wide temperature range without the use of constant-temperature chamber.

It is an object of the present invention to improve the temperature characteristics of a crystal oscillator using such a type as a DT-cut crystal or an NT-cut crystal which is readily available and of low price and thereby to obtain performance equivalent to that of an oscillator using a high-priced GT-cut crystal vibrator.

It is another object of the invention to impart excellent temperature characteristics equivalent to those of a GT-cut or AT-cut crystal to crystal vibrators of frequencies of the order of several tens or of several kilocycles per second which cannot be realized by GT-cut and AT-cut crystals for reasons of their vibration types.

The nature, principle, and details of the invention will be most clearly apparent by reference to the following description, when taken in conjunction with the accompanying drawing in which like parts are designated by like reference symbols, and in which.

Figure 7:
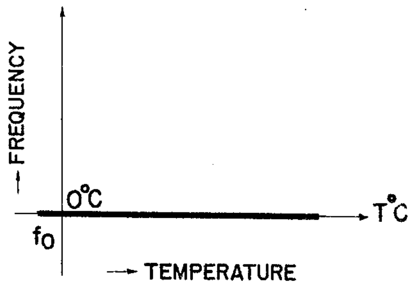
Figure 6A:
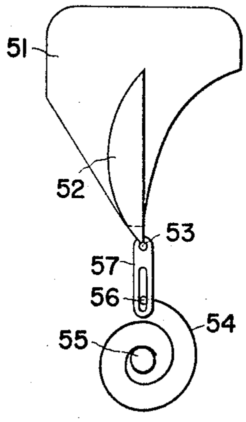
Figure 6B:
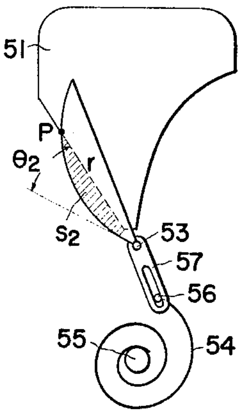
Figure 6C:
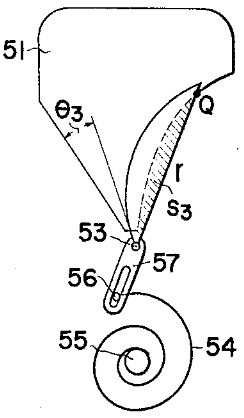

FIGS. 6(A), 6(B) and 6(C) illustrate, respectively, the functions of the temperature compensating device according to the present invention; and FIG. 7 is a graphical representation indicating the frequency-temperature characteristic of the temperature compensating crystal oscillator according to the present invention.

Figure 1A:
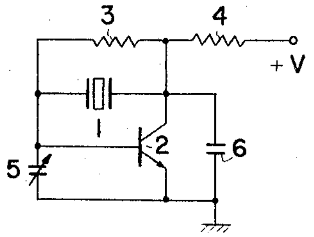
FIG. 1(A) is an electrical circuit diagram of a crystal oscillator of the Colpitts type.

Referring to FIG. 1(A), which shows one typical example of the transistor crystal oscillator of the Colpitts type having a crystal 2-terminal type, the oscillator comprises an oscillating transistor 2 with a 2-terminal type crystal vibrator connected between the collector and base of the said oscillating transistor 2, a bias resistance 3, a load resistance 4, and capacitors 5 and 6 for satisfying the oscillating conditions.

Figure 1B:
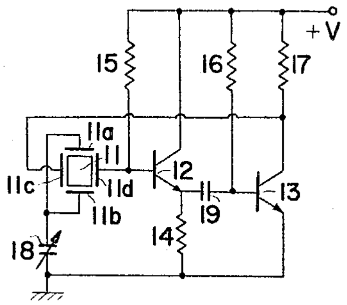
FIG. 1(B) is an electrical circuit diagram of a crystal oscillator of feedback type in which a crystal vibrator of 4-terminal type is used.

Referring to FIG. 1(B), which shows an example of the oscillator circuit having a crystal of 4-terminal type, being widely used in low frequency crystal vibrators, the oscillator comprises a transistor 12, an emitter follower composed of an emitter resistance 14 and a bias resistance 15, a 4-terminal type crystal vibrator 11 with its opposing electrodes 11*a* and 11*b* which are short-circuited so as to be grounded through a capacitor 18 adapted for minute adjustment of the frequency, an electrode 11*c* connected to the collector of an amplifying transistor device comprising a transistor 13, a bias resistance 16 and a load resistance 17, and another electrode 11*d* connected to the input terminal of the emitter follower, thereby forming an oscillator of the feedback type.

Figure 2:
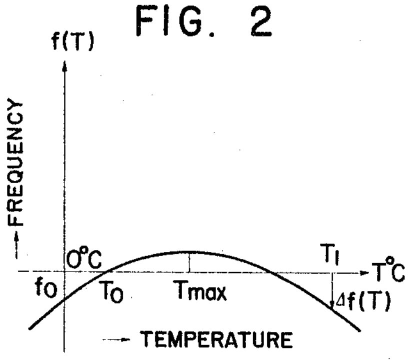
FIG. 2 is a graphical representation indicating the frequency-temperature characteristic of the crystal oscillator shown in FIG. 1(A) or (1(B)

In either of the above mentioned circuits, a crystal having dielectric characteristic is caused to vibrate in its inductive state, but the equivalent inductance thereof is of such a large magnitude that the oscillating frequency of the circuit is determined almost entirely by the frequency of the crystal. However, strictly speaking, such a frequency does change, although slightly, due to the external circuit constant. Therefore, it has been a well known practice to carry out a minute adjustment of the oscillating frequency by means of the capacitor 5 as shown in FIG. 1(A) of the capacitor 18 as shown in FIG. 1(B). The frequency-temperature characteristic of the oscillator shown in FIG. 1, in the case of a generally used crystal vibrator of DT-cut or CT-cut or a crystal of NT-cut or XY-cut adapted to be used in low frequency range, approximates very closely to a second degree curve as shown in FIG. 2.

Figure 3:
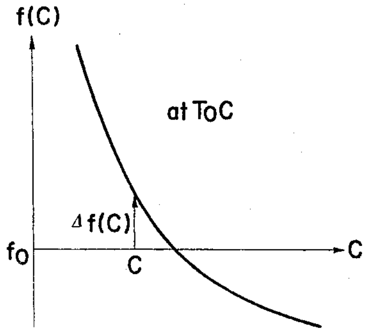
FIG. 3 is a graphical representation indicating the frequency-capacitance characteristic, with variation in capacitance of the capacitor 5 or 18, of the crystal oscillator shown in FIG. 1(A) or 1(B)

On the other hand, it has been found that the vibration of oscillation frequency of an oscillator in the case when the capacitance of the capacitor 5 or 18 such as that shown in FIG. 1(A) or FIG. 1(B) is caused to vary at a constant temperature $T_0$° C. can be represented by the characteristic curve as indicated in FIG. 3 wherein the X-axis represents the capacitance of the capacitor 5 or 18, and the Y-axis represents the oscillating frequency of the same. Although the actual values represented by X- and Y-axis may be different in both the oscillating circuits as shown in FIG. 1(A) and FIG. 1(B), the characteristic curves can be indicated by almost equal equations and, therefore, can be represented by a single graph.

$\Delta F(C_0)$ represents the variation in the oscillating frequency in the case when the value of the capacitor 5 or 18 is $C_0$. Hence, as can be seen in FIG. 3, in order to maintain a desired oscillating frequency $f_0$ at a constant value regardless of the ambient temperature, $\Delta f(T)$ corresponding to the deviation from the center frequency at the temperature $T_1$° C. as shown in FIG. 2 should be compensated for through the variation of the capacitor 5 as shown in FIG. 1(A) or the capacitor 18 as shown in FIG. 1(B).

That is, the adjustment of the capacitor 5 or 18 at the temperature $T_0$° C., in FIG. 3, should be executed in the manner indicated by the following Equation 2.

$$\Delta f(T)+\Delta f(C)=0 \qquad (2)$$

Hence, if we can obtain the capacitor 5 or 18 capable of satisfying always Equation 2 any temperature, it becomes possible to maintain a constant ocsillation frequency. The capacitors 5 and 18 will be referred to as temperature compensating capacitors hereinbelow.

Figure 4:
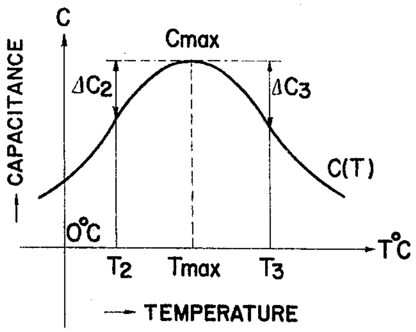
FIG. 4 is a graphical representation indicating the temperature-characteristic of the capacitance necessary for compensating for the frequency-temperature characteristic shown in FIG. 2.

FIG. 4 represents the capacitance-temperature characteristic which such a temperature compensating capacitor should possess, which can be obtained from the frequency-temperature characteristic of the crystal oscillator shown in FIG. 2 and the frequency-capacitance characteristic thereof shown in FIG. 3, as indicated by Equation 3.

$$\Delta f(T_0)=0,\ \left(\frac{\partial C}{\partial T}\right)f=\frac{\left(\frac{\partial f}{\partial T}\right)C}{\left(\frac{\partial f}{\partial C}\right)T} \tag{3}$$

Figure 5A:
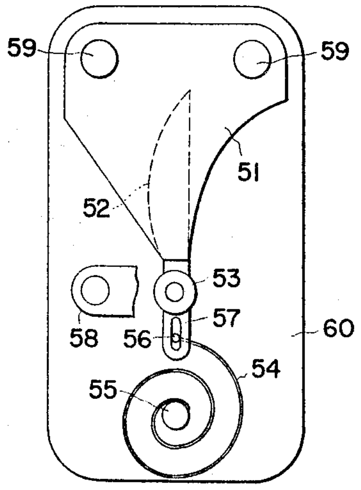
FIG. 5(A) is a plan view showing the temperature compensating device according to the present invention.
Figure 5B:
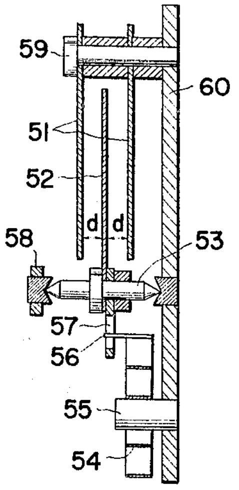
FIG. 5(B) is a sectional side view of the device as shown in FIG. 5(A)

FIGS. 5(A) and 5(B) are a plan view and a sectional view, respectively, of a temperature compensating capacitor having the capacitance-temperature characteristic shown in FIG. 4. The said capacitor, which is a specific embodiment of the present invention, is an air capacitor, usable in the circuits in FIGS. 1(A) and 1(B) as capacitors 5 and 18, comprising a stationary plate 51 and a rotating plate 52 with a clearance *d* provided between said plates 51 and 52. The expansion and contraction due to variations in temperature of an amber copper bimetal 54 the center of which is secured to a base plate 60 by a pin 55 is transmitted through a guide pin 56 provided at the free end of the bimetal 54 to a guide 57 having a slit and secured to the rotating shaft 53 of the rotating plate 52, thus rotating the plate 52. A bridge 58 holds a bearing of the rotating shaft 53. The fixed plate 52 is supported by a support 59 on the base plate 60.

FIG. 6(A) indicates the condition of the temperature compensating capacitor at the temperature of $T_{max.}$° C. in FIG. 4, wherein the rotating plate 52 and the stationary plate 51 overlap each other completely, thereby indicating the maximum capacitance. Assuming that the total area of the rotating plate to be *St*, $C_{max.}$ in FIG. 4 can be expressed by the following Equation 4.

$$C_{max}=2\epsilon_0\frac{St}{d} \tag{4}$$

where $\epsilon_0$ is the dielectric constant of the air.

Referring to FIG. 6(B) corresponding to the temperature $T_2$ in FIG. 4, the areas of a portion of the rotating plate protruding from the stationary plate can be calculated from the configuration of the external curve, on the left side, of the rotating plate 52 by the following Equation 5.

$$s_2=\int_0^{\theta_2}\frac{r_2}{2}\,d\theta \tag{5}$$

where $\theta$ is the angle of rotation, while the decrease in capacitance is so set as to be equal to $\Delta C_2$ in FIG. 4, that is;

$$\Delta C_2=2\epsilon_0\frac{s_2}{d} \tag{6}$$

where *r*, as shown in FIG. 6(B) is the distance from the intersection P of the external curve of the rotating plate and the external straight line of the stationary plate to the center 53 of rotation.

Referring to FIG. 6(C) corresponding to the temperature $T_3$ in FIG. 4, the areas of a portion of the rotating plate protruding from the stationary plate can be calculated from the configuration of the external curve, on the right side, of the stationary plate 51 by the following Equation 7.

$$s_3=\int_0^{\theta_3}\frac{r^2}{2}\,d\theta \tag{7}$$

where $\theta_3$ is the angle of revolution, while the decrease in capacitance is so set as to be equal to $\Delta C_3$ in FIG. 4; that is, the external curve on the right side of the stationary plate, i.e., *r* is so determined as to satisfy the Equation 8.

$$\Delta C_3=2\epsilon_0\frac{s_3}{d} \tag{8}$$

where *r* is the distance from the intersection Q of the external curve of the stationary plate and the external straight line of the rotating plate to the center of rotation 53.

It is necessary that the relationship expressed by the Equation 6 and 8 be established at any optional temperature.

Referring to FIG. 7, there is shown the frequency-temperature characteristic of a crystal oscillator having the temperature compensating capacitor shown in FIG. 5, in the case when for example, a 4-term crystal vibrator of XY-cut is oscillated in the manner as shown in FIG. 1(B), and, furthermore, a temperature compensating capacitor according to the present invention is applied to the capacitor 18 shown in FIG. 1(B). With this configuration it is possible to obtain a crystal oscillator with a frequency deviation of about $5\times10^{-7}$ in the temperature range from 0° C. to 40° C. The temperature characteristic of an actual crystal oscillator is not always as smooth as that shown in FIG. 2 and sometimes assumes a complicated curve due to the influence of a twin crystal or the like, so that equivalent compensation results can be obtained by suitably designing the electrode plates of the temperature compensating capacitor in accordance with Equation 2 so as to acquire an appropriate temperature characteristic thereof, irrespective of the frequency-temperature characteristic.

It should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention as set forth in the appended claims.

What we claim is:

1. In a temperature compensating device for a crystal oscillator of the type in which variation of a capacitance is utilized to vary oscillation frequency, the oscillator having an oscillation transistor and a two-terminal crystal vibrator connected between the collector and base of said oscillation transistor, the improvement which comprises a capacitor to vary the capacitance of the capacitor between the emitter and base of said transistor to compensate error due to temperature variation of the crystal oscillator, said capacitor comprising a stator of spiral form, a bimetal fixed to the center of said spiral, a rotor mounted for rotation by deformation of said bimetal, and means pivotally mounting said rotor, whereby said rotor of the capacitor is rotated by the deformation of the bimetal induced by temperature variations, and the capacitance determined by the extent of the overlapped area of the stator and rotor at any given temperature compensates said temperature error of the crystal oscillator at said given temperature.

2. In a temperature compensating device for a crystal oscillator of the type in which variation of a capacitance is utilized to vary the oscillation frequency and for use in a four-terminal crystal vibrator having one terminal of one of the facing electrodes connected to a collector of an oscillation transistor and the other terminal connected to the base of signal detecting transistor, and having both terminals of the other electrode short-circuited, the improvement which comprises a capacitor grounding said other electrode and connectable to said vibrator for varying capacitance therein, for compensating the error due to temperature variation of said crystal oscillator, said capacitor comprising a stator of spiral form, a bimetal element fixed to the center of said spiral, and a rotor mounted for rotation by deformation of said bimetal element, whereby said rotor of the capacitor is rotated by deformation of said bimetal element induced by the temperature variation, and the capacitance determined by the overlapped areas of the stator and rotor at any given temperature compensates said temperature error of the crystal oscillator at said given temperature.

No references cited.

ROY LAKE, *Primary Examiner.*

J. KOMINSKI, *Examiner.*